(12) United States Patent
Kitazawa

(10) Patent No.: US 10,219,076 B2
(45) Date of Patent: Feb. 26, 2019

(54) AUDIO SIGNAL PROCESSING DEVICE, AUDIO SIGNAL PROCESSING METHOD, AND STORAGE MEDIUM

(71) Applicant: CANON KABUSHIKI KAISHA, Tokyo (JP)

(72) Inventor: Kyohei Kitazawa, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/630,723

(22) Filed: Jun. 22, 2017

(65) Prior Publication Data

US 2017/0374463 A1 Dec. 28, 2017

(30) Foreign Application Priority Data

Jun. 27, 2016 (JP) ................. 2016-126937

(51) Int. Cl.
| | |
|---|---|
| *H04R 3/12* | (2006.01) |
| *H04R 1/40* | (2006.01) |
| *H04R 3/00* | (2006.01) |
| *H04R 3/04* | (2006.01) |
| *H04R 27/00* | (2006.01) |

(Continued)

(52) U.S. Cl.
CPC ............. *H04R 3/12* (2013.01); *G06T 7/70* (2017.01); *G10L 21/0208* (2013.01); *H03G 3/32* (2013.01); *H04N 7/183* (2013.01); *H04R 1/406* (2013.01); *H04R 3/005* (2013.01); *H04R 3/04* (2013.01); *H04R 27/00* (2013.01); *H04R 29/002* (2013.01);
(Continued)

(58) Field of Classification Search
CPC .......... H04R 3/005; H04R 1/406; H04R 3/04; H04R 29/005; H04R 3/12; H04R 27/00; H04R 29/002; G10L 2021/02166; G10L 21/028; G10L 2021/02082; G10L 21/0208; G10L 20/0272; G06T 7/70; G06T 2207/10016; G06T 2207/10028; G06T 2207/20012; G06T 2207/30252; H04N 7/15; H04N 7/183; H03G 3/3005; H03G 3/32

See application file for complete search history.

(56) References Cited

U.S. PATENT DOCUMENTS

2014/0226838 A1* 8/2014 Wingate ............. G10L 21/0272
381/111
2015/0289075 A1* 10/2015 Citerin ................... G01S 3/802
381/92

FOREIGN PATENT DOCUMENTS

GB       2514184 A  * 11/2014
JP    2012-165189 A    8/2012
(Continued)

*Primary Examiner* — Yogeshkumar Patel
(74) *Attorney, Agent, or Firm* — Canon U.S.A., Inc. IP Division

(57) ABSTRACT

An audio signal processing device includes a sound acquisition unit configured to acquire audio data generated by collecting a sound in a sound collection target space, a selection unit configured to select, based on a priority of each of a plurality of areas in the sound collection target space, one or more of the areas in the sound collection target space, and an output unit configured to output processed data, for which predetermined signal processing for the areas selected by the selection unit is executed on the audio data acquired by the sound acquisition unit, and the predetermined signal processing for an area not selected by the selection unit is not executed on the audio data.

20 Claims, 9 Drawing Sheets

(51) Int. Cl.
    *H04R 29/00*     (2006.01)
    *G06T 7/70*     (2017.01)
    *G10L 21/0208*     (2013.01)
    *H03G 3/32*     (2006.01)
    *H04N 7/18*     (2006.01)
    *H03G 3/30*     (2006.01)

(52) U.S. Cl.
    CPC .. *G10L 2021/02082* (2013.01); *H03G 3/3005* (2013.01)

(56) References Cited

FOREIGN PATENT DOCUMENTS

| | | | |
|---|---|---|---|
| JP | 2014-072708 A | * | 4/2014 |
| JP | 2014-72708 A | | 4/2014 |

* cited by examiner

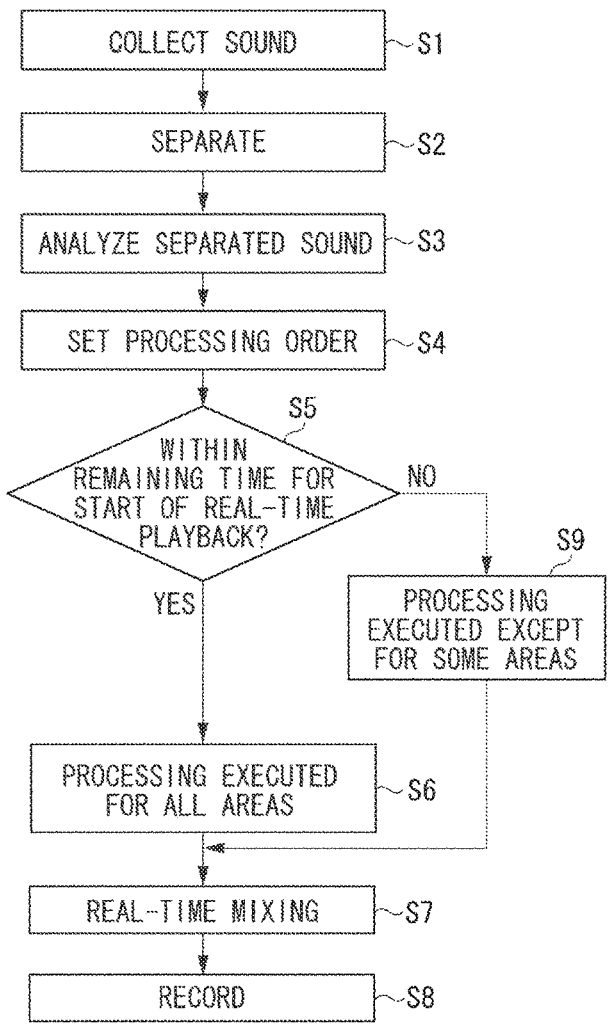
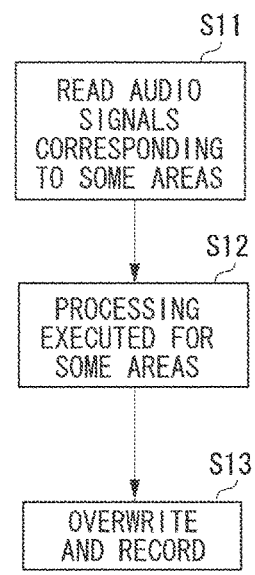
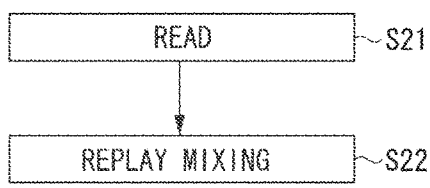

US 10,219,076 B2

AUDIO SIGNAL PROCESSING DEVICE, AUDIO SIGNAL PROCESSING METHOD, AND STORAGE MEDIUM

BACKGROUND OF THE INVENTION

Field of the Invention

One disclosed aspect of the embodiments relates to an audio signal processing device and an audio signal processing method.

Description of the Related Art

Conventionally, a technique of segmenting a space into a plurality of areas and acquiring (collecting) a sound in each of the areas has been known (Japanese Patent Application Laid-Open No. 2014-72708). In recent years, sound collection techniques featuring high directionality have been proposed to achieve clearer recording/emphasizing of a sound at a far location (Japanese Patent Application Laid-Open No. 2012-165189). In Japanese Patent Application Laid-Open No. 2012-165189, a sound in a target area is collected with a microphone having a high directionality that can record a sound at a far distant location, whereby sounds can be collected with a considerably large space segmented into detail areas.

Logically, the sound collection performed with the considerably large space segmented into detail areas involves a large number of sound collection areas. A larger number of sound collection areas lead to a larger processing amount of audio signal processing, including echo cancellation and denoising, executed on each of the sound collection areas. Thus, an attempt to perform real-time playback with sounds collected from a large number of sound collection areas might end up in lacked audio data (discontinuous sound) due to a failure to successfully complete the entire audio signal processing.

SUMMARY OF THE INVENTION

According to an aspect of the embodiments, an audio signal processing device includes a sound acquisition unit, a selection unit, and an output unit. The sound acquisition unit is configured to acquire audio data generated by collecting a sound in a sound collection target space. The selection unit is configured to select, based on a priority of each of a plurality of areas in the sound collection target space, one or more of the areas in the sound collection target space. The output unit is configured to output processed data, for which predetermined signal processing for the areas selected by the selection unit is executed on the audio data acquired by the sound acquisition unit, and the predetermined signal processing for an area not selected by the selection unit is not executed on the audio data.

Further features of the disclosure will become apparent from the following description of exemplary embodiments with reference to the attached drawings.

BRIEF DESCRIPTION OF THE DRAWINGS

FIGS. 2A, 2B, and 2C are each a flowchart illustrating audio signal processing according to the first exemplary embodiment.

DESCRIPTION OF THE EMBODIMENTS

Figure 1:
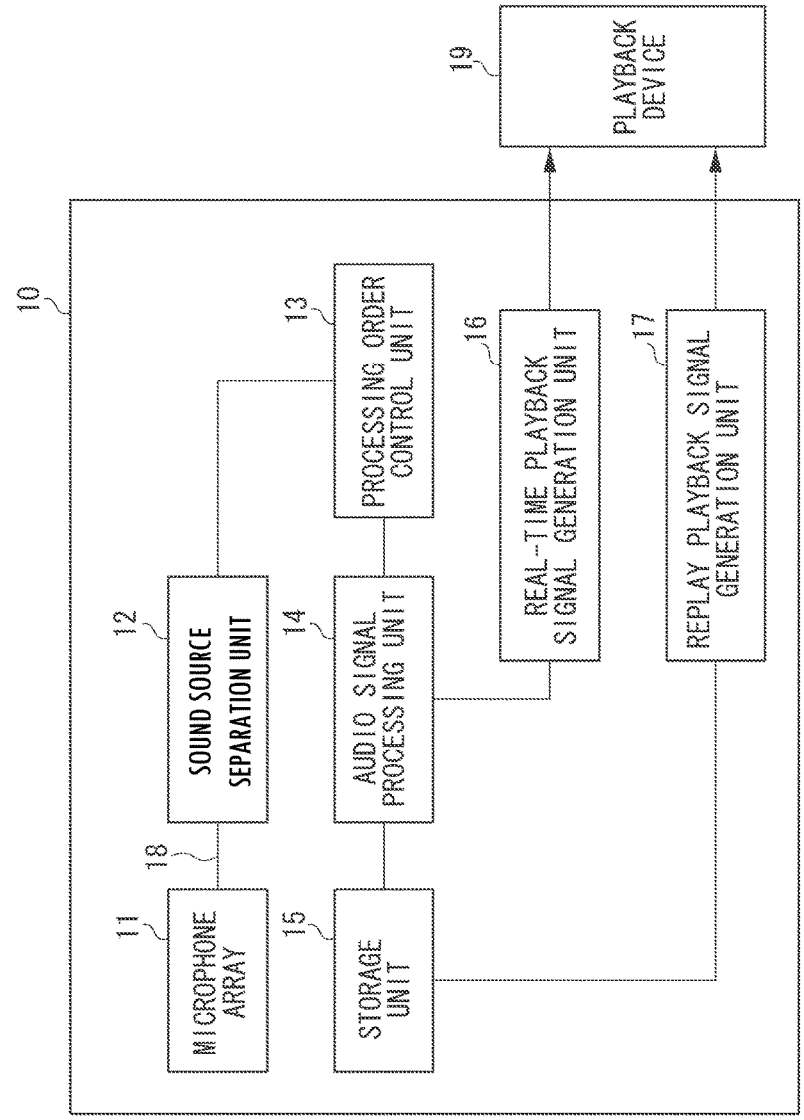
FIG. 1 is a block diagram illustrating a functional configuration of an audio signal processing device according to a first exemplary embodiment.

Exemplary embodiments of an audio signal processing device according to the disclosure are described with reference to the attached drawings. It is to be noted that the disclosure is not limited to the exemplary embodiments described below. A solution provided by the disclosure does not necessarily require all combinations of features described in the exemplary embodiments. Configurations according to the exemplary embodiments may be modified and changed as appropriate in accordance with a specification and various conditions (such as a condition and an environment where a device is used) of a device employing an embodiment. In the description below, the same components are denoted with the same reference numeral. The term "sound" in this specification is not limited to a human voice, and includes general sounds such as a human voice, a call of an animal, music, and environmental sounds.

A first exemplary embodiment is described. An audio signal processing device according to the first exemplary embodiment is described as a part of an audio system. The audio system is used in a broadcast system for a sport broadcasting for example, that performs real-time broadcasting (live broadcasting) and replay broadcasting with a viewpoint (camera orientation) different from that in the real-time broadcasting.

Configuration of Audio Signal Processing Device:

FIG. 1 is a functional block diagram illustrating a configuration of an audio signal processing device 10. The audio signal processing device 10 includes a microphone array 11, a sound source separation unit 12, a processing order control unit 13, an audio signal processing unit 14, a storage unit 15, a real-time playback signal generation unit 16, and replay playback signal generation unit 17. The components of the audio signal processing device 10 are connected to each other via a bus 18. The audio signal processing device 10 is in wired or wireless connection with a playback device 19.

The microphone array 11 includes a plurality of microphones. The microphone array 11 is connected to the sound source separation unit 12. The microphone array 11 collects sounds in a sound collection target space with the microphones, performs analog to digital (A/D) conversion to obtain audio signals representing the collected sounds, and then outputs the signals to the sound source separation unit 12. The microphone array 11 serves as a sound collection unit.

The sound source separation unit 12 acquires the audio signal (audio data) input from the microphone array 11, and executes sound source separation processing by using the audio signals, with the space segmented into N areas (N>1). The sound source separation processing is processing of extracting the sound in a processing target area from the received audio signals. The sound source separation processing is executed once in each processing frame, that is, in a predetermined time period (time interval, unit time). For example, the sound source separation unit 12 executes beamforming processing once in every predetermined time period described above, to acquire an audio signal for each area (a). The acquired audio signal is output to the processing order control unit 13 together with information on time (t).

The processing order control unit 13 receives an audio signal S(t, a) corresponding to each time (t) and area (a) from the sound source separation unit 12. The processing order control unit 13 outputs a signal for controlling an order of the audio signal processing executed by the audio signal processing unit 14 for each time and area based on time and area information acquired from the audio signal S(t, a). For example, the processing order control unit 13 compares the sounds at the acquisition time between adjacent areas, to determine whether an audio signal of one area is masked by the sound in an adjacent area. The processing order control unit 13 sets an area determined to be masked to come later in the audio signal processing order. In the present exemplary embodiment, the masked area is regarded to have a low degree of importance. The processing order control unit 13 determines priorities of a plurality of areas and sets an area with a higher priority to come earlier (be more prioritized) in the audio signal processing order, and sets an area with a low priority to come later in the audio processing order. The processing order control unit 13 sets the processing order in such a manner that an area with a higher degree of importance (priority) comes earlier. The processing order control unit 13 sets the processing order of audio signals corresponding to the areas, based on a predetermined condition, that is, whether the area is masked.

For example, the audio signal processing unit 14 includes a processing device such as a microprocessor. The audio signal processing unit 14 receives the output signal (the signal for controlling/setting the audio signal processing order) from the processing order control unit 13. The audio signal processing unit 14 periodically monitors a processing amount (a load condition) of the audio signal processing device 10. The audio signal processing unit 14 processes an audio signal corresponding to each time and area, in accordance with the control signal (setting signal) for the audio signal processing order. Examples of processing executed by the audio signal processing unit 14 include delay correction processing for correcting an influence of a distance between the sound collection unit (microphone array 11) and an area, gain correction processing, and echo cancellation processing. In the present exemplary embodiment, the audio signal processing unit 14 executes a plurality of types of processing (such as the delay correction processing, the gain correction processing, and the echo cancellation processing) in a fixed order.

Case Where Processing Amount of Processing Device is Smaller than Predetermined Amount:

When the processing amount of (a load on) the processing device is smaller than a predetermined amount, the processing on audio signals corresponding to all the areas in a processing frame can be completed within a predetermined time period. In such a case, the audio signal processing unit 14 outputs audio signals obtained with all the types of processing executed for all the areas to the real-time playback signal generation unit 16 and the storage unit 15. When the audio signal processing unit 14 can complete the processing on the audio signals corresponding to all the areas in one processing frame, within the predetermined time period, the real-time playback signal generation unit 16 can generate a real-time playback signal as a result of executing all the types of processing for all the areas. Thus, the audio signal processing unit 14 determines time required for completing predetermined signal processing corresponding to all of the plurality of areas, and selects all of the plurality of areas as target areas of the predetermined signal processing, when the determined processing time does not exceed a predetermined threshold.

Case Where Processing Amount of Processing Device is Equal to or Larger than Predetermined Amount:

The real-time playback signal cannot be generated when the processing on the audio signals corresponding to all the areas in a certain time (a certain processing frame) requires the processing amount of the processing device that is equal to or larger than the predetermined amount. The audio signal processing unit 14 executes the following signal processing when the processing amount of the processing device is equal to or larger than the predetermined amount.

The audio signal processing unit 14 manages a remaining time for start of real-time playback, time required for completing each type of processing, and the like. The time required for completing each type of processing depends on a load on the processing device, and thus the time required for completing the entire processing depends on the load on the processing device. When the time required for completing the entire processing exceeds the remaining time for start of real-time playback, the audio signal processing unit 14 outputs audio signals corresponding to some areas for which the processing has been partially omitted, to the real-time playback signal generation unit 16 and the storage unit 15. The time required for completing the processing exceeds the remaining time for start of real-time playback when all the types of processing cannot be completed on all areas within the remaining time for start of real-time playback. In such a case, all the types of processing are executed on some areas in the descending order of the degree of importance (priorities) without exceeding the remaining time for start of real-time playback, in accordance with the processing order set by the processing order control unit 13, (executed on areas for which the processing has been determined to be completable within the remaining time for start of real-time playback). Then, the audio signals obtained as a result of the processing are output to the real-time playback signal generation unit 16 and the storage unit 15. The processing is partially executed on areas for which the processing has been determined not to be completable within the remaining time for start of real-time playback, and the resultant signals are output to the real-time playback signal generation unit 16 and the storage unit 15. For example, the processing is partially executed when one of the three types of processing to be executed is omitted. Priorities are set for the three types of processing so that one with the lowest priorities is omitted first. Information on the omitted processing is recorded in a processing wait list. For example, an area, time, and the type of omitted processing are written in the processing wait list. More specifically, the audio signal processing unit 14 selects one or more areas in the sound collection target space, based on the priority set for each of a plurality of areas in the sound collection target space. Then, the audio signal processing unit 14 outputs processed data obtained with predetermined signal processing executed for selected areas and not executing for unselected areas, to the real-time playback signal generation unit 16 and the storage unit 15.

The audio signal processing unit 14 determines whether the processing on all areas can be executed within the remaining time for start of real-time playback, and thus determines whether the processing on audio signals corresponding to all the areas is completable within a predetermined time period. When the processing on audio signals corresponding to all the areas is not completable within the predetermined time period, information on areas for which the processing has not been completed is stored in the storage unit 15.

When the processing load becomes low enough, the audio signal processing unit 14 acquires the audio signals corresponding to the areas for which the processing has been partially omitted from the storage unit 15 based on the processing wait list described above, executes the omitted processing, and outputs the resultant signal to the storage unit 15. The information on the processing that has been completed is deleted from the processing wait list.

For example, the storage unit 15 is a storage device, such as a hard disk drive (HDD), a solid state drive (SSD), and a memory, in which the audio signal, output from the audio signal processing unit 14, is stored while being associated with time and area.

The real-time playback signal generation unit 16 performs mixing by using sounds corresponding to the areas acquired from the audio signal processing unit 14 to generate the real-time playback signal, and outputs the signal to the signal playback device 19. The real-time playback signal generation unit 16 acquires information from the outside to perform sound source mixing. For example, the information includes a virtual hearing point (the position of a listener) within the space changing over time, an orientation of a virtual listener, and a playback environment. The playback environment indicates a type of the playback device 19 (a speaker, a headphone, or the like) that performs the playback with the signal generated by the real-time playback signal generation unit 16.

Upon receiving replay playback request with a time point designated, the replay playback signal generation unit 17 acquires audio data corresponding to the time point from the storage unit 15, executes processing that is similar to that executed by the real-time playback signal generation unit 16, and outputs the resultant signal. More specifically, the replay playback signal generation unit 17 performs mixing by using audio signals corresponding to the areas obtained from the storage unit 15 to generate a replay playback signal, and outputs the resultant audio signal to the playback device 19.

Flow of Audio Signal Processing:

FIG. 2A to FIG. 2C are each a flowchart illustrating processing executed by the audio signal processing device 10 according to the present exemplary embodiment.

FIG. 2A illustrates a flow from the sound collection to generation of the real-time playback signal. First of all, as illustrated in FIG. 2A, in step S1, the microphone array 11 collects sounds in a space. The microphone array 11 outputs the audio signals, corresponding to the collected sounds in channels, to the sound source separation unit 12.

Next, in step S2, the sound source separation unit 12 executes sound source separation to acquire a sound source for each of areas obtained by segmenting the space based on boundaries set in advance (information for segmenting the space). The sound source separation unit 12 outputs audio signals corresponding to the areas, obtained by the separation, to the processing order control unit 13.

Next, in step S3, the processing order control unit 13 performs separated sound analysis, and in step S4, the processing order control unit 13 performs processing order setting. More specifically, in step S3, the processing order control unit 13 performs the separated sound analysis, using the audio signals corresponding to the areas input as described above, by comparing an audio signal corresponding to a target area with audio signals corresponding to peripheral areas, and performing an analysis to determine whether the sound of the target area is masked by the sounds in the peripheral areas. The processing order control unit 13 performs the processing order setting in step S4 based on the result of the analysis, to set a processing order of the audio signals corresponding to the areas. The processing order control unit 13 outputs the audio signals corresponding to the areas for which the processing order have been set to, the audio signal processing unit 14. The processing order setting may be referred to as processing order control.

Next, in step S5, the audio signal processing unit 14 determines whether the processing on the input audio signals corresponding to the areas is completable within the remaining time for start of real-time output (playback). More specifically, in step S5, the audio signal processing unit 14 periodically monitors the load condition of the audio signal processing device 10, and determines whether the processing is completable within the remaining time for start of real-time output in accordance with the load condition. More specifically, in step S5, the audio signal processing unit 14 determines whether the processing amount of the signal processing is equal to or smaller than the predetermined amount. When the load on the audio signal processing device 10 is low and thus the processing can be completed within the remaining time for start of real-time output (playback) (YES in step S5), the processing proceeds to step S6. In step S6, the audio signal processing unit 14 executes the processing on the audio signals corresponding to all the areas. Step S6 in FIG. 2A is written as "processing executed for all areas" because the processing is executed on the audio signals corresponding to all the areas. Then, the audio signal processing unit 14 outputs the audio signals after the processing to the real-time playback signal generation unit 16 and to the storage unit 15. The state in which the load on the audio signal processing device 10 is low, means that the load is lower than a predetermined amount. When the processing is completable within the remaining time for start of real-time playback, the processing is completable within a predetermined time period.

When it is determined that the processing is not completable within the remaining time for start of real-time output (playback) (NO in step S5), the processing proceeds to step S9. In step S9, the audio signal processing unit 14 outputs the audio signals to the real-time playback signal generation unit 16 and to the storage unit 15, with the processing on the audio signals corresponding to some areas that come late in the processing order omitted, based on the order set by the processing order control unit 13. In this process, the information on the area for which the processing has been omitted is recorded in the processing wait list. Step S9 in FIG. 2A, executed when the result of the determination in step S5 is NO, is written as "processing executed except for some areas" because the processing is omitted for the sounds corresponding to some areas. In step S9, the processing is executed for areas in the processing order without exceeding the remaining time for start of real-time playback, and thus all the types of processing are executed on the audio signals corresponding to the areas that come early in the processing order.

After step S6 or S9, the processing proceeds to step S7. In step S7, the real-time playback signal generation unit 16 performs audio mixing for real-time playback. The sound (signal) for real-time playback obtained by the mixing is output to the external playback device 19 as the real-time playback signal. The audio signal processing device 10 may output (transmit) the real-time playback signal to a device other than the playback device 19 as a broadcast signal.

Then, in step S8, the storage unit 15 records the input audio signals corresponding to the areas.

A replay playback audio signal is generated by using the audio signals corresponding to the areas recorded in the storage unit 15.

Next, processing executed when the load on the audio signal processing device 10 becomes low enough after the processing in step S9 in FIG. 2A is described with reference to FIG. 2B. More specifically, processing executed when the load on the audio signal processing device 10 becomes low enough after the audio signals corresponding to the areas, for which the processing has been partially omitted so as not to exceed the remaining time for start of real-time playback, have been recorded in the storage unit 15 is described. Here, as an example where the processing is partially omitted, a case is described where the echo cancellation processing is omitted in a configuration of executing the delay correction processing, the gain correction processing, and the echo cancellation processing.

In step S11, when the load on the audio signal processing device 10 decreases below a predetermined amount, the audio signal processing unit 14 reads the audio signals corresponding to the areas in the unprocessed state from the storage unit 15, based on the processing wait list. Step S11 in FIG. 2B is written as "read audio signals corresponding to some areas" because the step involves the signal processing executed for some areas.

Then, in step S12, the audio signal processing unit 14 executes processing recorded in the processing wait list (the echo cancellation processing unexecuted by the audio signal processing unit 14). In the present exemplary embodiment, only the echo cancellation processing is executed on the audio signals corresponding to the areas for which the delay correction processing and the gain correction processing have been executed but the echo cancellation processing has been omitted. The audio signals after the echo cancellation processing is output to the storage unit 15.

In step S13, the storage unit 15 performs recording by overwriting the input audio signals corresponding to the areas on the previous data (audio signals).

FIG. 2C illustrates a flow of processing executed when replay playback is requested. When the replay playback is requested, in step S21, the replay playback signal generation unit 17 reads the audio signals corresponding to the areas falling within the replay time from the storage unit 15.

Then, in step S22, the replay playback signal generation unit 17 performs mixing for the replay playback audio signals. The audio signal obtained as a result of the replay playback mixing is output to the playback device 19 or to the other device as a broadcast signal.

Effect of First Exemplary Embodiment:

As described above, the audio signal processing device 10 according to the present exemplary embodiment controls (sets) the signal processing order of areas, based on audio signals corresponding to the areas. Thus, real-time broadcast can be performed with execution of the audio processing on areas with high degrees of importance (priorities) guaranteed. More specifically, when the processing amount of the signal processing executed by the audio signal processing unit 14 is equal to or larger than the predetermined amount, a conventional configuration might result in real-time playback lacking sounds. In view of this, in the present exemplary embodiment, when the processing amount of the signal processing executed by the audio signal processing unit 14 is equal to or larger than the predetermined amount, the audio signal processing unit 14 executes all the types of signal processing for areas in the processing order without exceeding the remaining time for start of real-time playback, and outputs the resultant audio signals to the sound playback unit. Thus, the real-time playback is performed with all the types of audio processing executed on areas with high degrees of importance. The audio signal processing device 10 outputs processed data for the real-time playback based on the audio signals acquired by the sound collection and the selected areas, and then outputs processed data for replay playback obtained with the predetermined signal processing for the selected areas executed and the predetermined signal processing for unselected areas executed. Thus, in the present exemplary embodiment, the areas (areas with low degrees of importance) for which the audio processing has been partially omitted for the real-time playback are provided with all the types of audio processing later, so that replay playback can be executed with a playback sound generated with audio signals for which the audio processing has been completed.

Modification:

The microphone array 11 including the microphones in the present exemplary embodiment may alternatively include a combination of a microphone and a structure such as a reflector.

The microphones used in the microphone array 11 may be omnidirectional microphones, directional microphones, or a combination of these. Thus, the microphone array 11 may include at least one directional microphone.

The sound source separation unit 12 according to the present exemplary embodiment executes sound collection for each area through beamforming. Alternatively, other sound source separation methods may be employed. For example, the separation may be performed with a Weiner filter based on a Power Spectrum Density (PSD) estimated for each area.

In the present exemplary embodiment, the processing order control unit 13 sets the processing order based on determination on masking through comparison between a target area and an adjacent area. Alternatively, other types of information and condition may be used for setting the processing order. For example, a condition may be set in such a manner that the processing is executed earlier for an area involving an event. More specifically, a condition may be set for sounds of a sport, in such a manner that the processing is executed earlier for an area close to a goal. A condition may be set for sounds of a city in such a manner that the processing is executed earlier for an area where people and cars pass through such as an area close to an intersection. Alternatively, the processing order may be set based on a characteristic of an audio signal acquired through sound collection for an area. For example, the audio signal processing device 10 may include a unit for determining whether a sound collection signal (audio signal) corresponding to an area includes an audio signal representing a human voice, and may set an area involving the human voice to come early in the processing order (have a higher priority). Alternatively, the level of the collected sound signal (audio signal) may be compared between areas, so that an area with a higher level comes earlier in the processing order.

Alternatively, the processing order may be controlled (set) in accordance with the virtual hearing point (position of a virtual listener) and the orientation of the virtual listener set when the real-time playback signal is generated. More specifically, the processing order control unit 13 may acquire information on the hearing point corresponding to a playback sound based on the audio signal acquired by sound collection, and may determine a priority of each of a plurality of areas, based on the information on the hearing point. For example, a sound collection signal corresponding to an area closer to the virtual hearing point may be set to come earlier in the processing order. More specifically, a priority of each of a plurality of areas may be set in such a manner that a higher priority is set to an area including a position of the hearing point compared with an area not including the position of the hearing point. The comparison for checking the influence of the masking may be performed with areas within a predetermined angular range set based on the hearing point and the orientation of the listener, instead of performing the comparison with the adjacent areas. In such a case, the comparison for checking the masking may be performed after the delay correction and a volume correction are performed in accordance with a distance from a virtual hearing point. To achieve this configuration, the audio signal processing device 10 includes a distance acquisition unit configured to acquire distances between the microphone array 11 and each area.

The processing order control unit 13 according to the present exemplary embodiment sets the plurality of types of processing (such as the delay correction, the gain correction, and the echo cancellation processing) to be executed in the same order (fixed processing order). Alternatively, the processing order may be varied in accordance with a sound collection condition (long distance sound collection, short distance sound collection, and the like). Generally, a longer (farther) distance between the microphone array and a sound collection area is expected to involve a larger influence of an echo. Thus, the echo cancellation processing is set to be executed earlier than the delay correction processing and the gain correction processing when the distance between the microphone array and the sound collection area is long (long distance sound collection). On the other hand, the echo cancellation processing may be executed later when the distance between the microphone array and the sound collection area is short (short distance sound collection). Thus, the delay correction processing, the gain correction processing, and the like are executed on the area earlier than the echo cancellation processing. Furthermore, the processing order may be determined based on various aspects, in accordance with a plurality of conditions as described above.

The audio signal processing unit 14 according to the present exemplary embodiment executes the delay correction processing, the gain correction processing, and the echo cancellation. Other types of processing may be additionally executed. For example, the audio signal processing unit 14 may execute denoising processing and the like on each area.

In the exemplary embodiment described above, the processing for areas that come late in the processing order is partially omitted, when the processing amount of the audio signal processing unit 14 is equal to or larger than the predetermined amount. Alternatively, the processing may be completely omitted.

In the present exemplary embodiment, the replay playback signal generation unit 17 and the real-time playback signal generation unit 16 execute similar processing (mixing). Alternatively, the replay playback signal generation unit 17 and the real-time playback signal generation unit 16 may execute different types of mixing. For example, the real-time playback signal generation unit 16 might receive sounds not processed by the audio signal processing unit 14. Thus, the real-time playback signal generation unit 16 may change the mixing level (quality) in accordance with whether the processing has been executed. For example, the real-time playback signal generation unit 16 may lower the mixing level when the unprocessed sound is received.

In the configuration illustrated in FIG. 1, the microphone array 11 is in the audio signal processing device 10. Alternatively, the microphone array 11 may not be included in the audio signal processing device 10. In such a configuration, the sound source separation unit 12 receives an audio signal from the microphone array 11 that is an external device.

Hardware Configuration:

At least a part of the functional blocks illustrated in FIG. 1 may be implemented with hardware. For example, the functional block may be implemented with a dedicated circuit automatically generated on a Field Programmable Gate Array (FPGA) from a program for implementing steps by using a predetermined compiler for example. The hardware may be implemented with a Gate Array circuit formed in a manner similar as that for the FPGA. Furthermore, the hardware may be implemented with an Application Specific Integrated Circuit (ASIC).

Figure 3:
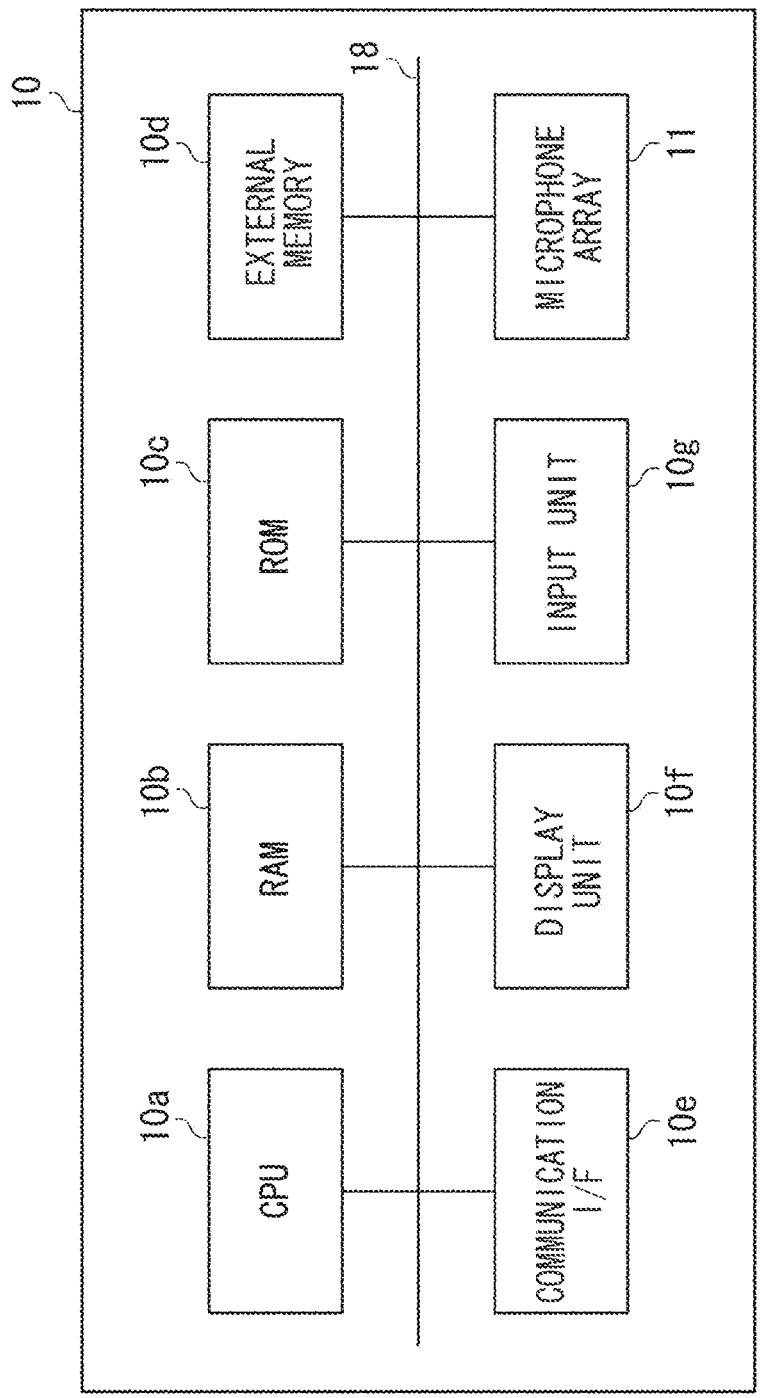
FIG. 3 is a block diagram illustrating a hardware configuration of the audio signal processing device according to the first exemplary embodiment.

FIG. 3 is a diagram illustrating a hardware configuration of the audio signal processing device 10. In this example, the audio signal processing device 10 includes a central processing unit (CPU) 10a, a random access memory (RAM) 10b, a read only memory (ROM) 10c, an external memory 10d, a communication interface (I/F) 10e, a display unit 10f, an input unit 10g, and the microphone array 11. The CPU 10a can implement the functions of the components of the audio signal processing device 10 according to the first exemplary embodiment described above, by executing a program stored in the RAM 10b, the ROM 10c, the external memory 10d, or the like. The audio signal processing device 10 can implement each processing in FIG. 2 with the CPU 10a reading and executing a required program. The communication I/F 10e is an interface used for communicating with external apparatuses and devices. The audio signal processing device 10 can communicate with the playback device 19 illustrated in FIG. 1 via the communication I/F 10e. The display unit 10f may include various displays. For example, the display unit 10f may display a separation status of the sound source separation processing. The input unit 10g may include a keyboard, a pointing device (such as a mouse), a touch panel, and various switches. A user may use the input unit 10g to issue a replay playback request to the audio signal processing device 10. The audio signal processing device 10 may further include an image capturing unit that captures an image of a subject in an area.

A second exemplary embodiment is described. In the configuration according to the first exemplary embodiment, a single device 10 includes the microphone array 11, the audio signal processing unit 14, the real-time playback signal generation unit 16, and the replay playback signal generation unit 17. The disclosure is not limited to this configuration. For example, the microphone array and the audio signal processing unit may be in a single device, and the playback signal generation units may be implemented as a configuration (system) provided separately from the device. The microphone array may employ a directional microphone array. An audio signal corresponding to a sound collected by the directional microphone array may be immediately processed by the audio signal processing unit. The audio signal processing system having such a configuration is described in a second exemplary embodiment. Components that are the same as those in the first exemplary embodiment are denoted with the same reference numerals.

(Configuration of Audio Signal Processing System 20)

Figure 4:
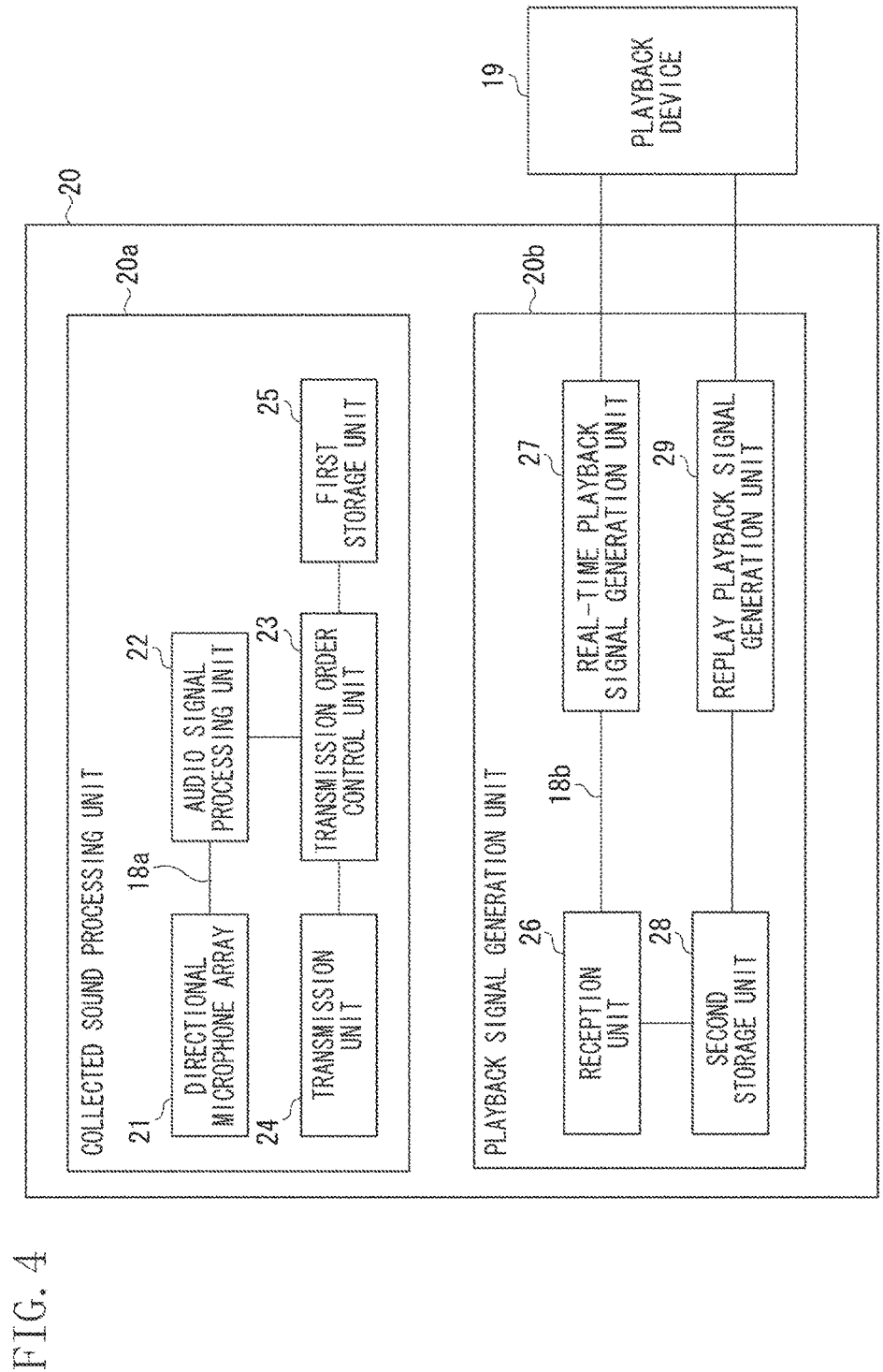
FIG. 4 is a block diagram illustrating a configuration of an audio signal processing system according to a second exemplary embodiment.

FIG. 4 is a block diagram illustrating a configuration of an audio signal processing system 20 according to the second exemplary embodiment. The audio signal processing system 20 includes a collected audio processing unit 20a and a playback signal generation unit 20b. The collected audio processing unit 20a and the playback signal generation unit 20b are in wired or a wireless connection with each other, and transmit and receive data to and from each other through a wired communication unit or a wireless communication unit.

The collected audio processing unit 20a includes a directional microphone array 21, an audio signal processing unit 22, a transmission order control unit 23, a transmission unit 24, and a first storage unit 25. The first storage unit 25 holds a non-transmitted area list. The components of the collected audio processing unit 20a are connected to each other via a bus 18a.

For example, the directional microphone array 21 includes a plurality of shotgun microphones arranged to collect sounds corresponding to N areas (N>1) obtained by segmenting the space. The sound in each area is subjected to the A/D conversion and is output to the audio signal processing unit 22 for each predetermined time frame size.

The audio signal processing unit 22 executes the delay correction processing, the gain correction processing, the denoising processing, the echo cancellation processing, and the like as in the case of the audio signal processing unit 14 according to the first exemplary embodiment. The audio signal processing unit 22 outputs the audio signal corresponding to each area after the processing, to the transmission order control unit 23.

The transmission order control unit 23 controls (sets) the transmission order in accordance with the influence of masking of sounds in an area, a level (volume) of the sound in the area, a feature parameter of the sound in the area, a stationarity of the sound in the area, and the like, as in the case of the processing order control unit 13 according to the first exemplary embodiment. For example, the transmission order control unit 23 determines the nonstationarity of the audio signal S(t, a) corresponding to the time t and the area a. When during a predetermined time period, a non-stationary sound is generated, the transmission order control unit 23 determines that an important event is occurring in the area involving the sound, and sets the transmission order in such a manner that the transmission is performed earlier for the area with more frequent occurrences of the non-stationary sounds. Thus, the area involving frequent occurrence of the non-stationary sound is considered as an area with a high degree of importance (priority). More specifically, the transmission order control unit 23 determines an occurrence position of a predetermined event in the sound collection target space based on the audio signal acquired by the sound collection, and determines the priority of each of a plurality of areas, based on the event occurrence position thus determined. For example, the transmission order control unit 23 sets the priority of each of the plurality of areas in such a manner that a higher priority is set to the area including the occurrence position of the predetermined event compared with the area not including the occurrence position of the predetermined event. The transmission order control unit 23 according to the present exemplary embodiment determines the priority of each of the plurality of areas, based on the predetermined condition which is a frequency of the occurrence of the non-stationary sound, and sets the transmission order in such a manner that an area with a higher priority comes earlier in the transmission order (prioritized) and an area with a low priority comes later in the transmission order. However, how the event occurrence position is determined is not limited to this.

The transmission order control unit 23 determines whether processing for the audio signal S(t, a) can be completed within the remaining time for start of real-time playback (broadcasting), based a signal transmission amount between the collected audio processing unit 20a and the playback signal generation unit 20b and the set transmission order (order of the audio signal transmission). For example, the determination is made by determining whether the signal transmission amount between the collected audio processing unit 20a and the playback signal generation unit 20b is equal to or larger than a predetermined amount. The transmission order control unit 23 outputs the audio signal corresponding to the area for which the processing is determined to be completable within the remaining time for start of real-time playback, to the transmission unit 24. On the other hand, the transmission order control unit 23 outputs the audio signal corresponding to the area for which the processing is determined not to be completable within the remaining time for start of real-time playback (an audio signal that comes later in the transmission order in the case where the signal transmission amount is equal to or larger than the predetermined amount), to the first storage unit 25. The audio data not transmitted is managed (stored) in the non-transmitted area list in the first storage unit 25. Thus, when the transmission amount of the audio signals from the transmission unit 24 is equal to or larger than the predetermined amount, the transmission unit 24 does not transmit the audio signals corresponding to the area that comes late in the transmission order.

When the signal transmission amount between the collected audio processing unit 20a and the playback signal generation unit 20b decreases below the predetermined amount, the transmission order control unit 23 reads the audio signal corresponding to the non-transmitted area stored in the first storage unit 25, and outputs the audio signal to the transmission unit 24.

The transmission unit 24 sequentially transmits the audio signals corresponding to the areas, input from the transmission order control unit 23, to the playback signal generation unit 20b. The playback signal generation unit 20b may be referred to as a sound playback unit. The playback signal generation unit 20b includes a reception unit 26, a real-time playback signal generation unit 27, a second storage unit 28, and a replay playback signal generation unit 29. The components of the playback signal generation unit 20b are connected to each other via a bus 18b.

The reception unit 26 receives an audio signal output from the transmission unit 24, and outputs the audio signal to the real-time playback signal generation unit 27 and the second storage unit 28.

The real-time playback signal generation unit 27, the second storage unit 28, and the replay playback signal generation unit 29 have functions substantially the same as those of the real-time playback signal generation unit 16, the storage unit 15, and the replay playback signal generation unit 17 according to the first exemplary embodiment, and thus the description thereof is omitted.

Flow of Processing Executed by Audio Signal Processing System 20:

Next, a flow of processing executed by the audio signal processing system 20 is described with reference to FIG. 5A to FIG. 5C.

Figure 5A:
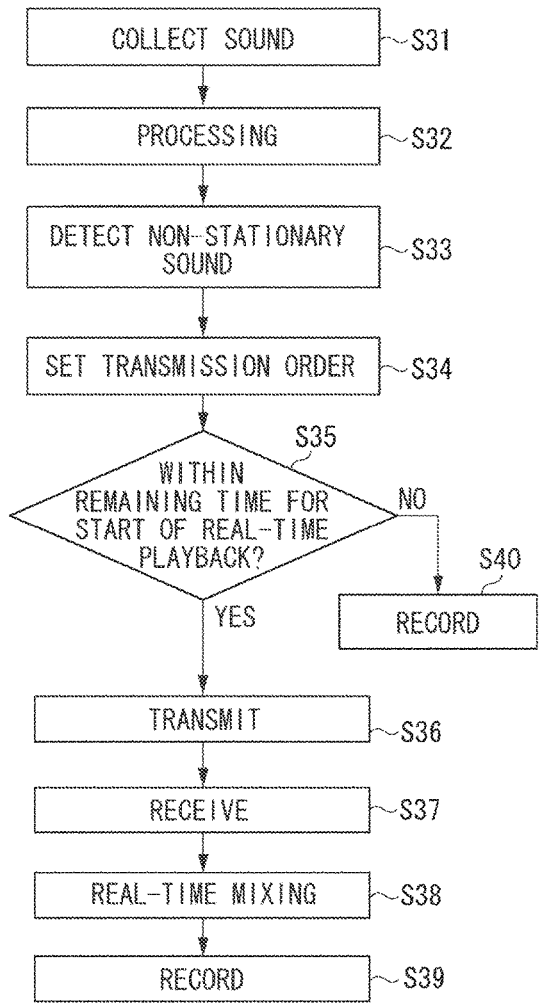
FIGS. 5A, 5B, and 5C are each a flowchart illustrating audio signal processing according to the second exemplary embodiment.
Figure 5B:
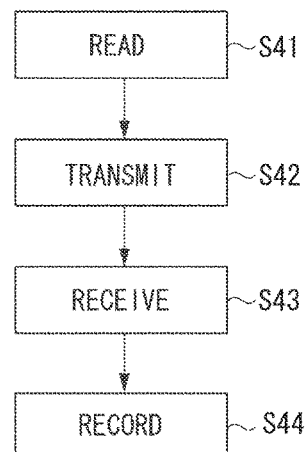

As illustrated in FIG. 5A, first of all, in step S31, the directional microphone array 21 collects sounds in a space.

The directional microphone array 21 outputs audio signals corresponding to sounds in the areas thus collected, to the audio signal processing unit 22.

In step S32, the audio signal processing unit 22 executes processing such as delay correction on the input audio signals. The audio signal processing unit 22 outputs the audio signal after the processing to the transmission order control unit 23.

In step S33, the transmission order control unit 23 performs detection of a non-stationary sound in each area by using the input audio signal. More specifically, the transmission order control unit 23 performs non-stationary sound detection to detect whether the audio signals include an audio signal indicating the non-stationary sound.

In step S34, the transmission order control unit 23 sets the transmission order in accordance with the result of the non-stationary sound detection in step S33. For example, the transmission order control unit 23 sets the transmission order of the audio signal for each area, in such a manner that the area in which the non-stationary sound is detected comes earlier in the transmission order (prioritized).

In step S35, the transmission order control unit 23 determines whether the transmission of the processed audio signal is completable within the remaining time for start of real-time playback. More specifically, the transmission order control unit 23 estimates time required for completing the transmission of data (audio signal) corresponding to areas for which the order has set, based on a communication load condition between the transmission unit 24 and the reception unit 26, and determines whether the transmission can be completed within the remaining time for start of real-time playback. When the result of the determines indicates that the transmission can be completed within the remaining time for start of real-time playback (YES in step S35), the transmission order control unit 23 outputs the audio data (audio signal) corresponding to the area to the transmission unit 24 and the processing proceeds to step S36. In step S36, the transmission unit 24 transmits the audio data (audio signal) corresponding to the area to the reception unit 26.

In step S37, the reception unit 26 receives the audio signal corresponding to the area transmitted from the transmission unit 24. The reception unit 26 outputs the received audio signal corresponding to the area to the real-time playback signal generation unit 27 and the second storage unit 28.

Steps S38 and S39 are respectively the same as steps S17 and S18 in the first exemplary embodiment (FIG. 2), and thus the description thereof is omitted.

On the other hand, when the transmission of the processed audio signal (audio signal transmission) is determined not to be completable within the remaining time for start of real-time playback in step S35 (NO in step S35), the processing proceeds to step S40. In step S40, the transmission order control unit 23 transmits the audio data (audio signal) corresponding to the area to the first storage unit 25, and thus the audio data is recorded in first storage unit 25. The audio data is recorded in the first storage unit 25 in such a manner that the corresponding processing frame number (or time), the corresponding area, and the like of the sound can be identified. Thus, the audio data is recorded (stored) in the first storage unit 25 while being associated with predetermined information.

Next, processing executed when the audio signal corresponding to the area is recorded in the first storage unit 25 because the processed sound transmission is determined not to be completable within the remaining time for start of real-time playback in step S35 in FIG. 5A, is described with reference to FIG. 5B.

In step S41, when the transmission load between the transmission unit 24 and the reception unit 26 decreases below the predetermined amount, the transmission order control unit 23 reads the audio signal corresponding to the non-transmitted area from the first storage unit 25. The audio signals are read in the ascending order of the frame number. Thus, the reading starts from an audio signal corresponding to the earliest time. The transmission order control unit 23 outputs the read audio signal to the transmission unit 24.

Step S42 is the same as step S36, and the description thereof is omitted.

When the processing in step S42 is completed, the processing proceeds to step S43. In step S43, the reception unit 26 receives the audio data. The reception unit 26 outputs the received audio data to the second storage unit 28.

Step S44 is the same as step S39, and the description thereof is omitted.

Figure 5C:
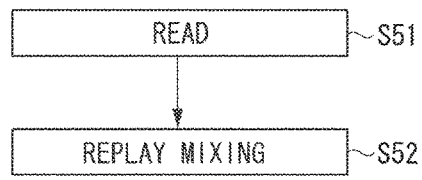

FIG. 5C illustrates a flow of processing executed when the replay playback is requested. The flow of the processing includes steps S51 and S52 that are respectively the same as steps S21 and S22 in the first exemplary embodiment (FIG. 2C), and thus the description thereof is omitted.

Effect of Second Exemplary Embodiment:

As described above, in the second exemplary embodiment, the transmission order of the audio signal is controlled and set based on the nonstationarity (frequency of the occurrence of the non-stationary sound). Thus, the real-time broadcasting can be performed with the audio signals, with the execution of the audio processing on areas with high degrees of importance guaranteed. More specifically, a conventional method might result in the real-time playback lacking sounds when the signal transmission amount from the transmission unit 24 to the reception unit 26 is equal to or larger than the predetermined amount. In the present exemplary embodiment, the transmission unit 24 transmits the audio signals in accordance with the set transmission order, without exceeding the remaining time for start of real-time playback. The transmission unit 24 does not perform transmission for the areas that come late in the transmission order. Thus, the audio signals corresponding to the areas with high degrees of importance (areas that come early in the transmission orders) are certainly received by the reception unit 26 to reach the real-time playback signal generation unit 27. As described above, in the audio signal processing system 20 according to the second exemplary embodiment, the audio signals corresponding to the areas with high degrees of importance are transmitted to the sound playback unit without exceeding the remaining time for start of real-time playback.

In the present exemplary embodiment, the audio signals corresponding to the areas (areas with low degrees of importance) for which the transmission has not been executable within the remaining time for start of real-time playback are transmitted later to the reception unit 26, so that the replay playback can be performed with a playback sound generated with the audio signals corresponding to all the areas.

Modification:

In the second exemplary embodiment, the directional microphone array 21 is used for collecting sounds in the areas. Alternatively, the microphone array may be used for collecting sound and then the sound source separation may be performed as in the first exemplary embodiment. An omnidirectional microphone may be disposed at the substantially center of each set area to collect the sound.

In the configuration illustrated in FIG. 4, the directional microphone array 21 is in the collected audio processing unit 20a. Alternatively, the directional microphone array 21 may not be included in the collected audio processing unit 20a. In such a configuration, the audio signal processing unit 22 receives the audio signal from the directional microphone array 21 that is an external device.

A third exemplary embodiment is described. The audio signal processing device described in the first exemplary embodiment processes the audio signal only. The disclosure may be implemented as a system that processes an audio signal and a video signal. The system that can execute audio signal processing and video signal processing is referred to as an image capturing processing system and is described below. The image capturing processing system according to the present exemplary embodiment may be referred to as an audio and video output system. Components that are the same as those in the first exemplary embodiment are denoted with the same reference numerals.

Figure 6:
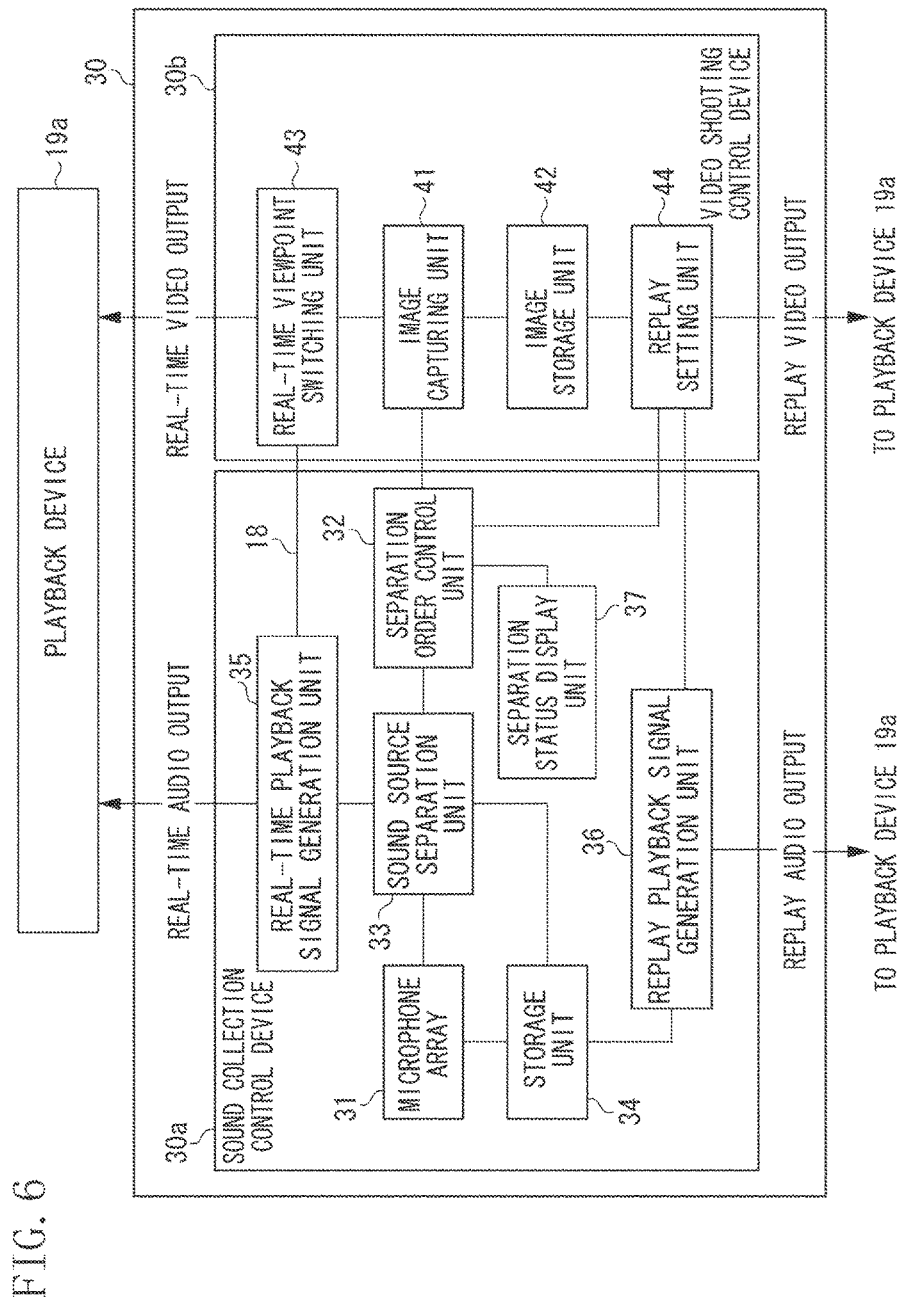
FIG. 6 is a block diagram illustrating a configuration of an audio signal processing system according to a third exemplary embodiment.

FIG. 6 is a block diagram illustrating a configuration of an image capturing processing system 30. The image capturing processing system 30 includes a sound collection control device 30a and a video shooting control device 30b. The sound collection control device 30a and the video shooting control device 30b are connected to each other via a bus 18.

The sound collection control device 30a includes a microphone array 31, a separation order control unit 32, a sound source separation unit 33, a storage unit 34, a real-time playback signal generation unit 35, a replay playback signal generation 36, and a separation status display unit 37. The components of the sound collection control device 30a are connected to each other via the bus 18.

The microphone array 31 is the same as the microphone array 11 according to the first exemplary embodiment. Thus, the description on the microphone array 31 is omitted.

The separation order control unit 32 acquires a video (image) captured by an image capturing unit 41 described below, segments a space in the captured image into a plurality of areas (for example, areas A, B, C, . . . ), and determines whether the segmented areas include a predetermined subject that may be a sound source such as a person, a car, or a musical instrument. The separation order control unit 32 determines a priority of each of the plurality of areas, based on the result of the determination, and thus sets the processing order of the sound source separation processing. More specifically, the separation order control unit 32 sets an area including the subject that may be a sound source to come early in the processing order of the sound source separation processing. In other words, the separation order control unit 32 determines the priority of each of the plurality of areas in such a manner a higher priority is set to an area including the position of the predetermined subject compared with an area not including the position of the predetermined subject. When the areas include a plurality of the subjects that may be sound sources (for example, when the areas include a plurality of persons), the separation order control unit 32 sets the processing order of the sound source separation processing in accordance with the number of subjects. For example, when the area A includes a single subject and the area B includes five subjects, the processing order is set in such a manner that the sound source separation processing is executed earlier on the area B than on the area A. More specifically, an area including a large number of subjects includes many persons and/or objects that may be the sound sources, and thus is regarded as an area with a high degree of importance (priority). The separation order control unit 32 according to the present exemplary embodiment determines a priority of each of a plurality of areas based on predetermined conditions, in such a manner that an area with a higher priority and an area with a lower priority respectively come earlier and later in the separation order.

When a replay setting unit 44 described below performs setting for replay playback, the separation order control unit 32 receives starting and ending time points of the replay playback (broadcasting), the remaining time for start of the replay broadcasting, and a viewpoint (orientation of a camera) of the replay, from the replay setting unit 44. The separation order control unit 32 resets the processing order of the sound source separation processing based on the received information. Thus, the separation order control unit 32 acquires viewpoint information corresponding to an image to be played along with the sound to be played based on the audio signals acquired by the sound collecting, and determines a priority of each of the plurality of areas, based on the acquired viewpoint information. For example, the separation order control unit 32 sets the priority of each of the plurality of areas in such a manner that a higher priority is set to an area including the position of the viewpoint corresponding to the viewpoint information compared with an area not including the position of the viewpoint corresponding to the viewpoint information. In another example, the separation order control unit 32 sets the priority of each of the plurality of areas in such a manner that a higher priority is set to an area including a position of a gazing point (intersection point of a subject with a line of sight corresponding to the viewpoint information) compared with an area not including the position of the gazing point. More specifically, the separation order control unit 32 refers to an unseparated area list described below, and extracts unseparated areas between replay starting and ending time points. The processing order of the sound source separation processing is reset in such a manner that the extracted area comes earlier in the sound source separation processing order (prioritized). When the replay playback is set while the sound source separation processing for the real-time playback is in process, the processing for the replay playback is executed without hindering the processing for the real-time playback. Thus, a ratio between the replay playback processing and the real-time playback processing in a case where the replay playback is set may be set in advance. For example, when the replay playback is set, the real-time playback processing may be executed on 80% of all the areas with the high processing priorities, and the replay playback processing may be allocated with the remaining time (the replay playback processing may be executed on the remaining 20% of the areas).

The separation order control unit 32 outputs information on the set processing order of the sound source separation processing to the sound source separation unit 33 and the separation status display unit 37.

The sound source separation unit 33 executes the sound source separation processing in accordance with the processing order input from the separation order control unit 32. The content of the sound source separation processing is the same as that in the first exemplary embodiment, and thus the description thereof is omitted. The sound source separation unit 33 according to the present exemplary embodiment further monitors the processing amount (load condition) of the sound source separation processing, and determines whether the sound (sound source) separation processing is completable on all the areas within the remaining time for start of real-time playback, when executed in the designated order. Upon determining that the processing is not completable within the remaining time for start of real-time playback, the sound source separation unit 33 does not execute the sound source separation processing on some audio signals, and outputs as the unseparated area list information on such audio signals to the source separation order control unit 32. More specifically, the sound source separation processing is executed on areas in the processing order (descending order of the degree of importance) without exceeding the remaining time for start of real-time playback, and the sound source separation processing is not executed on areas that come late in the processing order. Information recorded in the unseparated area list includes an area and time corresponding to the audio signal on which the sound source separation processing has not been executed (the time information may be information corresponding to time such as a processing frame number). The sound source separation unit 33 outputs the audio signal on which the sound source separation processing has been executed to the real-time playback signal generation unit 35 and the storage unit 34.

When the load of the sound source separation processing decreases below a predetermined amount, the sound source separation unit 33 reads an audio signal identified by the information recorded in the unseparated area list from the storage unit 34, as a sound of an area in the unseparated area list. The sound source separation unit 33 executes the separation processing on the audio signal, and then outputs the resultant signal to the storage unit 34 (recording). The information on the area and time corresponding to the audio signal on which the sound source separation processing has been executed is deleted from the unseparated area list.

The storage unit 34 is connected to the microphone array 31, so that the sounds in all the channels collected by the microphone array 31 can be recorded in the storage unit 34. The storage unit 34 is also connected to the sound source separation unit 33, so that the audio signal on which the separation has been executed by the sound source separation unit 33 can be recorded in the storage unit 34 while being associated with an area and time.

The real-time playback signal generation unit 35 generates the audio signal corresponding to the switching of the view point (camera orientation) from a real-time viewpoint switching unit 43 described below, and outputs the audio signal to a playback device 19a. The playback device 19a according to the present exemplary embodiment can play a sound and an accompanying video. The replay playback signal generation 36 acquires a corresponding separated audio signal for each time and area from the storage unit 34, in accordance with the viewpoint and replay starting and ending time points from a replay setting unit 44 described below. The replay playback signal generation 36 outputs the separated audio signal to the playback device 19a as replay playback audio signal.

Figure 7A:
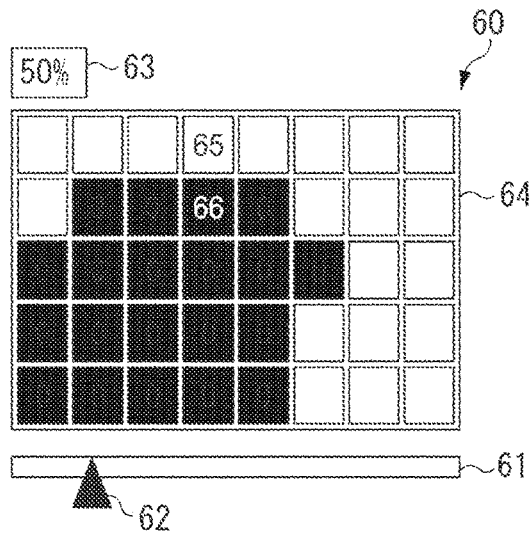
FIGS. 7A, 7B, and 7C are each a diagram illustrating a sound separation status according to the third exemplary embodiment.

The separation status display unit 37 is a display device connected to the separation order control unit 32, and displays a separation status of a sound corresponding to each time and area from the unseparated area list. FIG. 7A illustrates an example of a display screen 60 of the separation status display unit 37. The display screen 60 includes a time bar 61, a time cursor 62, a separation completion percentage display section 63, an all areas display section 64, unseparated areas 65, and separated areas 66.

The time bar 61 is a bar indicating a recording time so far, and the position of the time cursor 62 indicates the time of the display on the screen. The separation completion percentage display section 63 displays the percentage of the areas on which the separation processing has been completed in all the areas. In the example illustrated in FIG. 7A, the number of all the areas is 40, and the separation processing has been completed on 20 areas. Thus, 50% is displayed on the separation completion percentage display section 63. The all areas display section 64 displays the entire target areas.

Squares in the all areas display section 64 represent segmented areas. White squares displayed on the screen represent areas (unseparated areas) 65 on which the separation processing has not been completed, and black squares displayed on the screen represent areas (separated areas) 66 on which the separation processing has been completed. Thus, the unseparated areas 65 and the separated areas 66 are displayed in a distinguishable manner.

The video shooting control device 30b includes the image capturing unit 41, an image storage unit 42, the real-time viewpoint switching unit 43, and the replay setting unit 44. The components of the video shooting control device 30b are connected to each other via the bus 18.

The image capturing unit 41 includes a plurality of cameras (not illustrated). Each camera can capture a moving image (image capturing). The image capturing unit 41 captures an image of a space including all the areas as targets of the sound collection by the microphone array 31, and acquires the captured image of the sound collection target space. The image capturing unit 41 outputs the captured video (image) to the image storage unit 42.

The image storage unit 42 is a storage device, and records (stores) images captured by all the cameras.

For example, the real-time viewpoint switching unit 43 is a switcher that switches among the plurality of cameras of the image capturing unit 41, and outputs video from the camera selected by the switching, to the playback device 19a as a real-time video output. The real-time viewpoint switching unit 43 outputs the viewpoint information on the selected camera to the real-time playback signal generation unit 35.

The replay setting unit 44 sets the replay start and ending time points, replay broadcasting time, replay video viewpoint, and the like. The replay setting unit 44 reads a video from the image storage unit 42 based on the set information, and outputs the video to the playback device 19a as a replay video output. The replay setting unit 44 outputs the set information to the separation order control unit 32 and the replay playback signal generation 36.

Figure 8A:
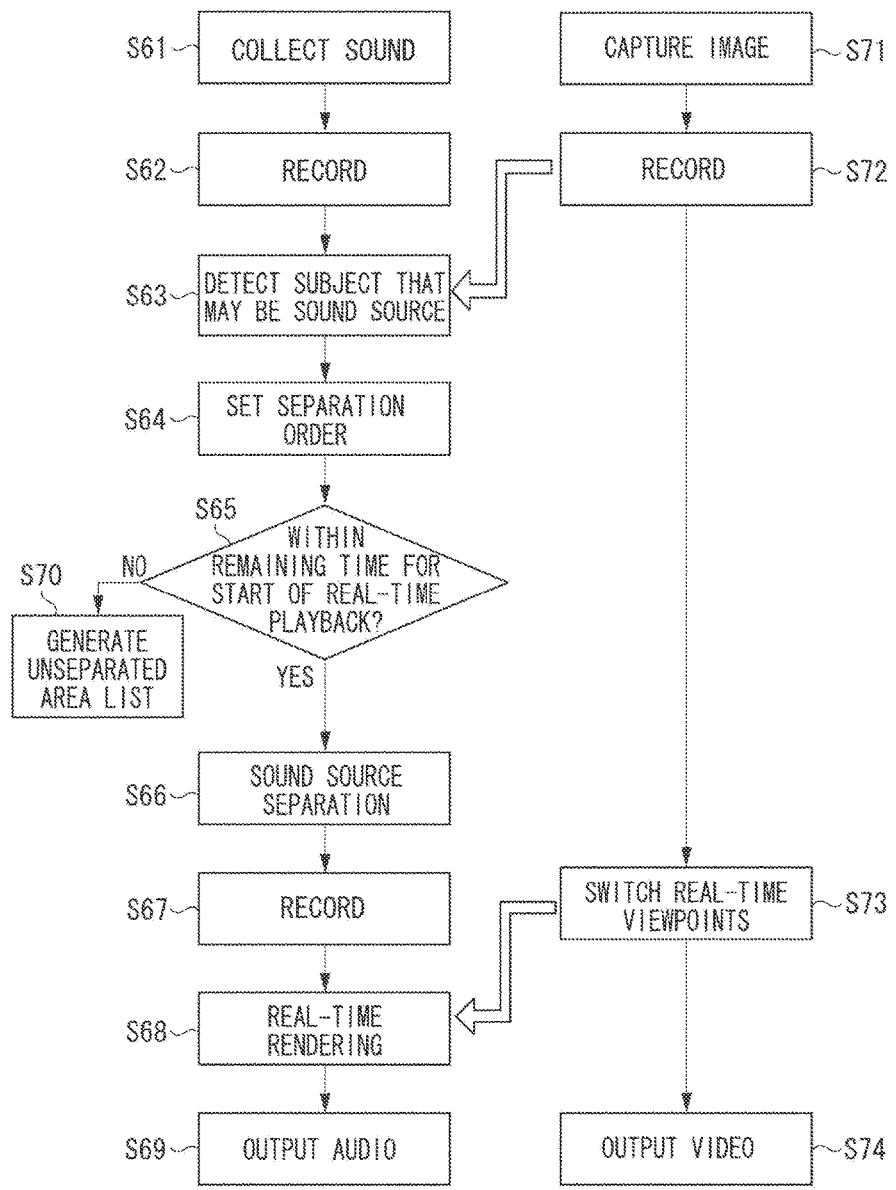
FIGS. 8A and 8B are each a flowchart illustrating audio signal processing according to the third exemplary embodiment.
Figure 8B:
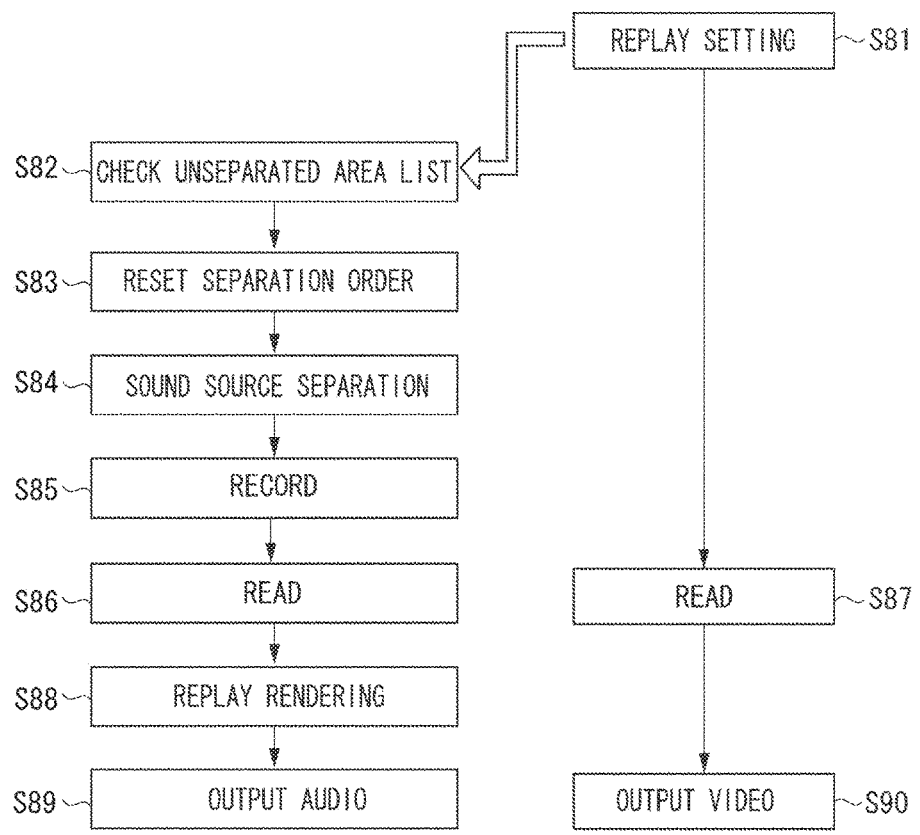

Flow of Processing Executed by Image Capturing Processing System 30:

FIG. 8A and FIG. 8B each are a flowchart illustrating an operation and processing in the image capturing processing system 30 according to the present exemplary embodiment. In the description below, the real-time viewpoint switching unit 43 switches the camera in the image capturing unit 41 (a camera different from one of a plurality of cameras that is currently used is selected), at a predetermined timing (step S73).

Processing executed when the real-time playback is performed is described with reference to FIG. 8A.

First of all, in step S61, the microphone array 31 collects sounds, and in step S71, the image capturing unit 41 captures an image. The audio data (audio signal) acquired via the microphone array 31 is output to the storage unit 34 and the sound source separation unit 33. The image data (image signal) acquired via the image capturing unit 41 is output to the image storage unit 42, the real-time viewpoint switching unit 43, and the separation order control unit 32.

Next, in step S62, the storage unit 34 records the audio data input to the storage unit 34. In step S72, the image storage unit 42 records the image data input to the image storage unit 42.

Then, in step S63, the separation order control unit 32 detects a subject that may be a sound source in each area from the input image data. For example, the separation order control unit 32 detects the subject with a face recognition technique or an object recognition technique.

In step S64, the separation order control unit 32 sets the order of the sound source separation based on the number of subjects that may be the sound sources in each area detected in step S63. Thus, in the present exemplary embodiment, the sound source separation order is set based on the sound source position information. The separation order control unit 32 outputs the set sound source separation order to the sound source separation unit 33.

Then, in step S65, the sound source separation unit 33 determines whether the sound source separation processing on all areas is completable within the remaining time for start of real-time playback, in accordance with the processing load of the sound source separation. The determination is performed for each area. Thus, the areas on which the sound source separation processing is executed without exceeding the remaining time for start of real-time playback is determined in the separation order.

In step S66, the sound source separation unit 33 executes the sound source separation processing with the audio signals corresponding to a plurality of channels input from the microphone array 31, on the areas for which the sound source separation processing has been determined to be completable within the remaining time for start of real-time playback in step S65 (the audio signals of the areas are separated and extracted). The sound source separation unit 33 outputs the audio signal corresponding to the separated area to the storage unit 34 and the real-time playback signal generation unit 35.

In step S67, the storage unit 34 records the audio signal corresponding to the separated sound in the area generated in step S66.

It is assumed that at this point, the processing proceeds to step S73 in which the real-time viewpoint switching unit 43 switches a viewpoint. With this viewpoint switching, a camera different from the current camera is selected. The real-time viewpoint switching unit 43 outputs the switched viewpoint information to the real-time playback signal generation unit 35.

In step S68, the real-time playback signal generation unit 35 generates a real-time playback audio signal based on the separated sound (audio signal) of each area input from the sound source separation unit 33 and the view point information input from the real-time viewpoint switching unit 43. The generation of the real-time playback audio signal in step S68 is written as real-time rendering in FIG. 8.

As final steps, in step S69, the real-time playback signal generation unit 35 outputs the real-time playback audio signal generated in step S68 to the playback device 19a, and in step S74, the image capturing unit 41 outputs the video captured by the camera selected by the viewpoint switching in step S73 to the playback device 19a.

In step S70, the sound source separation unit 33 records (adds) time information and area information of the unseparated area for which the sound source separation processing has been determined not to be completable within the remaining time for start of real-time playback in step S65, and thus the unseparated area list is generated.

Next, a flow of processing executed when the replay setting unit 44 performs the replay setting is described with reference to FIG. 8B.

First of all, in step S81, the replay setting unit 44 performs the replay setting. The replay setting unit 44 outputs the set replay start and ending time points, viewpoint information, and the like to the separation order control unit 32 and the replay playback signal generation 36.

Next, in step S82, the separation order control unit 32 checks the unseparated area list. The separation order control unit 32 extracts information on the unseparated area in the replay time from the unseparated area list. Then, in step S83, the separation order control unit 32 resets the separation order based on the extracted information on the unseparated area. The separation order control unit 32 outputs the separation order that has been reset, to the sound source separation unit 33. Then, in steps S84 and S85, separation and recording are executed. The processing in steps S84 and S85 are respectively the same as that in step S66 and S67 in FIG. 8A, and thus the detail description thereof is omitted.

Next, in step S86, the replay playback signal generation 36 reads the audio signal associated with time and area corresponding to the input from the replay setting unit 44, from the storage unit 34.

In step S87, the replay setting unit 44 reads the video (image data) corresponding to the replay time and the viewpoint (selected camera) from the image storage unit 42.

In step S88, the replay playback signal generation 36 generates replay playback signal. The generation of the replay playback audio signal in step S88 is written as replay rendering in FIGS. 8A and 8B.

As final steps, in step S89, the replay playback signal generation 36 outputs the audio signal generated in step S88 to the playback device 19a as a replay audio output, and in step S90, the replay setting unit 44 outputs the video data read in step S87 to the playback device 19a as a replay video output, in synchronization with the output of the audio signal.

Effect of Third Exemplary Embodiment:

In the present exemplary embodiment, the sound source separation order is set in accordance with the sound source position information. Thus, even when the sound source separation is not completable for all the areas within the remaining time for start of real-time playback due to a large processing load, the audio signals can be acquired with the audio signals corresponding to the areas including the sound source (sound source candidate) prioritized for the execution of the sound source separation. The area including the sound source candidate is an area with a high degree of importance. Thus, in the present exemplary embodiment, the real-time audio playback can be achieved without lacking the audio signal corresponding to the area with a high degree of importance.

Modification:

In the present exemplary embodiment, the separation order control unit 32 controls the separation order based on the video captured by the image capturing unit 41. Alternatively, the separation order control unit 32 may control and set the separation order based on other types of information. For example, the image capturing processing system 30 may further include a distance acquisition unit configured to acquire a distance between the microphone array 31 and an area. The separation order control unit 32 may control the separation order based on the distance acquired by the distance acquisition unit. The time required for sound propagation differs between an area far from the microphone array 31 and an area close to the microphone array 31. More specifically, the far area involves a longer time for the sound propagation resulting in a larger delay amount. Thus, the separation processing needs to be executed earlier for the sound in the far area. Thus, the separation order control unit 32 may set the processing timing to be earlier for an area farther from the microphone array 31. The processing order may be set based on the position of the microphone array 31.

In one known system (method) for live broadcasting such as television broadcasting, an image is broadcasted with a certain amount of delay time from the actual shooting time of the image (for example, a delay of about approximately several seconds to several minutes) to be prepared for time adjustment and other unexpected situations. When such a system is employed, the separation order control unit 32 may control the separation order in accordance with an event in a video, captured with the image capturing unit 41, within a running time corresponding to the delay time. For example, when a sport game is broadcasted live with a two-minutes delay, a region of interest may be set based on how the game has proceeded within two minutes, and the separation order of the areas may be controlled in accordance with the region of interest.

To guarantee the continuous sound, the separation order control unit 32 may acquire an average volume of a plurality of processing frames for each area, from the result of the sound source separation by the sound source separation unit 33, and control the order of the sound source separation based on the average volume. For example, from the average volume of a predetermined number of past (latest) frames for each area, a possibility of the sound source being included in the area (sound source presence possibility) may be estimated, and the area with a higher sound source presence possibility may be set to come earlier in the processing order. Areas around the areas with a high sound source presence possibility may also be set to come early in the processing order because the sound source might be movable.

The storage unit 34 according to the present exemplary embodiment records the audio signals as the sounds corresponding to all the channels collected by the microphone array 31. The amount of audio signals thus recorded might be too large depending on the shooting time and the number of microphones. The storage unit 34 may delete the audio signals corresponding to the time at which the separation processing has been completed on all the areas to prevent the recorded amount from being excessively large.

Figure 7B:
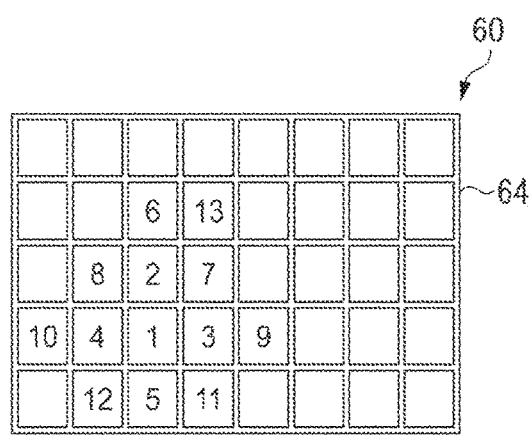

The display screen 60 (FIG. 7A) of the separation status display unit 37 according to the present exemplary embodiment displays the black and white squares to indicate whether the separation processing has been completed. Alternatively, the separation order set by the separation order control unit 32 may be displayed. For example, as illustrated in FIG. 7B, the display screen 60 may display numbers (numbers 1 to 13 in the figure) indicating the separation order in the displayed areas. Alternatively, colors (including gradation) corresponding to separation order may be displayed instead of the numbers 1 to 13 in FIG. 7B (or in addition to the numbers 1 to 13).

The separation status display unit 37 may display the viewpoint at the time of real-time playback, the viewpoint at the time of replay playback, and the position of the subject, on the display screen 60 in FIG. 7A or 7B in an overlapping manner. The separation status display unit 37 may display the all areas display section 64 in FIG. 7A or FIG. 7B on an image of the actual space in an overlapping manner.

Figure 7C:
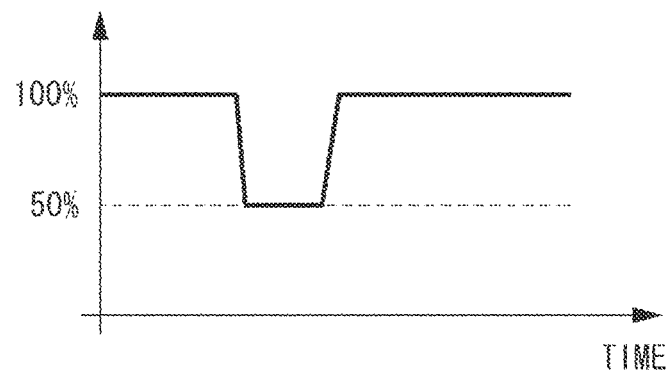

What is displayed on the separation status display unit 37 is not limited to those in FIG. 7A and FIG. 7B. Any things that can present the processing status (separation status) can be displayed. For example, as illustrated in FIG. 7C, the separation status may be presented in a form of a graph with a vertical axis representing the separation completion percentage (separation completion percentage display section) and a horizontal axis representing time. In FIG. 7C, a line graph representing the change in the separation completion percentage over time is displayed, whereby the separation status is presented in a simple format.

The separation status display unit 37 that has only the display function in the present exemplary embodiment described above, may further have a user interface function. For example, the display screen 60 may form a touch panel that may serve as a user interface for the separation order control unit 32. With this configuration, for example, the user may select at least one of the unseparated areas 65 on the display screen 60 and select the time point by using the time cursor 62, so that the designated area and the designated time point can be set to come early in the separation order.

The configuration illustrated in FIG. 6 includes no audio signal processing unit that executes delay correction, gain correction, echo cancellation, and the like (a processing unit similar to the audio signal processing unit 14 in FIG. 1). Alternatively, the audio signal processing unit may be provided between the sound source separation unit 33 and the storage unit 34.

In the configuration illustrated in FIG. 6, the microphone array 31 is in the sound collection control device 30*a*. Alternatively, the microphone array 31 may not be included in the sound collection control device 30*a*. In such a configuration, the sound source separation unit 33 receives the audio signal from the microphone array 31 that is an external device.

In the exemplary embodiments described above, processing or transmission is executed for audio signals in an order set based on a predetermined condition, and thus real-time playback lacking no predetermined (desired) sound can be achieved.

Other Embodiments:

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-126937, filed Jun. 27, 2016, which is hereby incorporated by reference herein in its entirety.

What is claimed is:

1. An audio signal processing apparatus comprising:
at least one hardware processor; and
a memory which stores instructions executable by the at least one hardware processor to cause the audio signal processing apparatus to perform at least:
acquiring audio data generated by collecting a sound in a sound collection target space;
determining a priority of at least one of a plurality of areas in the sound collection target space; and
outputting, based on the audio data acquired in the acquiring, first processed data obtained by first predetermined signal processing for sound of the one or more areas selected based on the priority determined in the determining; and
outputting, based on the audio data acquired in the acquiring, second processed data obtained by second predetermined signal processing for sound of areas including an area different from the one or more areas selected based on the priority determined in the determining, after outputting the first processed data obtained by the first predetermined signal processing for sound of the one or more areas selected based on the priority determined in the determining.

2. The audio signal processing apparatus according to claim 1,
wherein a processing time period required for executing the first predetermined signal processing is equal to or shorter than a predetermined threshold, and
wherein a processing time period required for executing the second predetermined signal processing is longer than the predetermined threshold.

3. The audio signal processing apparatus according to claim 1, wherein the first predetermined signal processing and the second predetermined signal processing include at least one of delay correction processing, gain correction processing, and echo cancellation processing.

4. The audio signal processing apparatus according to claim 1, wherein the first predetermined signal processing and the second predetermined signal processing are sound source separation processing of extracting a sound of a processing target area from the audio data.

5. The audio signal processing apparatus according to claim 1, wherein the instructions further cause the audio signal processing apparatus to perform:
obtaining a captured image of the sound collection target space;
wherein the priority is determined in the determining based on a position of a predetermined object in the captured image
obtained in the obtaining.

6. The audio signal processing apparatus according to claim 5, wherein the priority is determined in such a manner that a higher priority is set to an area including the position of the predetermined object compared with an area not including the position of the predetermined object.

7. The audio signal processing apparatus according to claim 1, wherein the instructions further cause the audio signal processing apparatus to perform:
obtaining viewpoint information corresponding to an image to be played together with a sound based on the audio data acquired in the acquiring,
wherein the priority is determined in the determining based on the viewpoint information
obtained in the obtaining.

8. The audio signal processing apparatus according to claim 7, wherein the priority is determined in such a manner that a higher priority is set to an area including a position of a viewpoint corresponding to the viewpoint information compared with an area not including the position of the viewpoint corresponding to the viewpoint information.

9. The audio signal processing apparatus according to claim 7, wherein the priority of is determined in such a manner that a higher priority is set to an area including a position of an intersection point of an object with a line of sight corresponding to the viewpoint information compared with an area not including the position of the intersection point.

10. The audio signal processing apparatus according to claim 1, wherein the instructions further cause the audio signal processing apparatus to perform:
obtaining information on a hearing point corresponding to a playback sound based on the audio data acquired in the acquiring,
wherein the priority is determined in the determining based on the information on the hearing point
obtained in the obtaining.

11. The audio signal processing apparatus according to claim 10, wherein the priority is determined in such a manner that a higher priority is set to an area including a position of the hearing point compared with an area not including the position of the hearing point.

12. The audio signal processing apparatus according to claim 1, wherein the instructions further cause the audio signal processing apparatus to perform:
judging an occurrence position of a predetermined event in the sound collection target space, based on the audio data acquired in the acquiring,
wherein the priority is determined in the determining based on the occurrence position
judged in the judging.

13. The audio signal processing apparatus according to claim 12, wherein the priority is determined in such a manner that a higher priority is set to an area including the predetermined event occurrence position compared with an area not including the predetermined event occurrence position.

14. The audio signal processing apparatus according to claim 1, wherein the instructions further cause the audio signal processing apparatus to perform:
setting a processing order of the plurality of areas, based on the priority determined in the determining; and
executing the first predetermined signal processing in accordance with the processing order set in the setting,
wherein the first processed data obtained by the first predetermined signal processing executed in the executing is outputted.

15. The audio signal processing apparatus according to claim 14, wherein
the priority is determined in the determining based on a position of a microphone that collects a sound in the sound collection target space to generate the audio data acquired
in the acquiring.

16. The audio signal processing apparatus according to claim 1, wherein in the first processed data outputted in the outputting, data corresponding to the one or more areas selected based on the priority determined in the determining is included and data corresponding to the area different from the one or more areas selected based on the priority determined in the determining is not included.

17. The audio signal processing apparatus according to claim 1, wherein
the priority is determined in the determining based on a volume of sound corresponding to each area and/or influence of masking corresponding to each area.

18. An audio signal processing method comprising:
acquiring audio data generated by collecting a sound in a sound collection target space;
determining a priority of at least one of a plurality of areas in the sound collection target space; and
outputting, based on the audio data acquired in the acquiring, first processed data obtained by first predetermined signal processing for sound of the one or more areas selected based on the priority determined in the determining; and
outputting, based on the audio data acquired in the acquiring, second processed data obtained by second predetermined signal processing for sound of areas including an area different from the one or more areas selected based on the priority determined in the determining, after outputting the first processed data obtained by the first predetermined signal processing for sound of the one or more areas selected based on the priority determined in the determining.

19. The audio signal processing method according to claim 18,
wherein a processing time period required for executing the first predetermined signal processing
is equal to or shorter than a predetermined threshold, and
wherein a processing time period required for executing the second predetermined signal processing is longer than the predetermined threshold.

20. A storage medium storing a program for causing a computer to execute an audio signal processing method, the audio signal processing method comprising:
acquiring audio data generated by collecting a sound in a sound collection target space;
determining a priority of at least one of a plurality of areas in the sound collection target space; and
outputting, based on the audio data acquired in the acquiring, first processed data obtained by first predetermined signal processing for sound of the one or more areas selected based on the priority determined in the determining; and
outputting, based on the audio data acquired in the acquiring, second processed data obtained by second predetermined signal processing for sound of areas including an area different from the one or more areas selected based on the priority determined in the determining, after outputting the first processed data obtained by the first predetermined signal processing for sound of the one or more areas selected based on the priority determined in the determining.

* * * * *